(12) United States Patent
Wang et al.

(10) Patent No.: US 10,732,224 B2
(45) Date of Patent: Aug. 4, 2020

(54) MONITORING BATTERY STATE OF CHARGE

(75) Inventors: Zhengming Wang, Greenwood, IN (US); Chad Hartzog, Kokomo, IN (US)

(73) Assignee: Enerdel, Inc., Indianapolis, IN (US)

( * ) Notice: Subject to any disclaimer, the term of this patent is extended or adjusted under 35 U.S.C. 154(b) by 495 days.

(21) Appl. No.: 13/576,785

(22) PCT Filed: Apr. 22, 2011

(86) PCT No.: PCT/US2011/033582
§ 371 (c)(1),
(2), (4) Date: Aug. 2, 2012

(87) PCT Pub. No.: WO2011/133863
PCT Pub. Date: Oct. 27, 2011

(65) Prior Publication Data
US 2012/0310568 A1 Dec. 6, 2012

Related U.S. Application Data

(60) Provisional application No. 61/326,881, filed on Apr. 22, 2010.

(51) Int. Cl.
*G01R 31/3842* (2019.01)
*G01R 31/367* (2019.01)

(52) U.S. Cl.
CPC ........ *G01R 31/3842* (2019.01); *G01R 31/367* (2019.01)

(58) Field of Classification Search
CPC ............ G01R 31/3624; G01R 31/3651; G01R 31/3842; G01R 31/367
See application file for complete search history.

(56) References Cited

U.S. PATENT DOCUMENTS

| | | | |
|---|---|---|---|
| 4,606,350 A | 8/1986 | Frost | |
| 4,651,066 A * | 3/1987 | Gritter | ................ B60L 11/1807 180/65.51 |
| 5,694,021 A | 12/1997 | Morioka et al. | |
| 5,839,816 A | 11/1998 | Varga et al. | |
| 6,063,519 A | 5/2000 | Barket et al. | |
| 6,083,912 A | 7/2000 | Khouri | |

(Continued)

FOREIGN PATENT DOCUMENTS

| | | |
|---|---|---|
| CN | 2791738 | 6/2006 |
| CN | 101411034 | 4/2009 |

(Continued)

OTHER PUBLICATIONS

International Search Report for International Application PCT/US2011/033582, dated Dec. 20, 2011, 4 pgs.

(Continued)

*Primary Examiner* — Alexander Satanovsky
(74) *Attorney, Agent, or Firm* — Faegre Drinker Biddle & Reath LLP

(57) ABSTRACT

Systems and methods for monitoring a state of charge of a battery are disclosed. An updated state of charge of the battery may be determined based on a measured terminal voltage of the battery, a measured current of the battery, and a value of at least one battery parameter selected from a plurality of values based on a prior state of charge of the battery.

30 Claims, 6 Drawing Sheets

(56) References Cited

U.S. PATENT DOCUMENTS

| | | |
|---|---|---|
| 6,191,590 B1 | 2/2001 | Klutz et al. |
| 6,194,874 B1 | 2/2001 | Kalogeropoulos et al. |
| 6,291,097 B1 | 9/2001 | Barket et al. |
| 6,300,763 B1 | 10/2001 | Kwok |
| 6,406,815 B1 | 6/2002 | Sandberg et al. |
| 6,413,668 B1 | 7/2002 | Sandberg et al. |
| 6,419,712 B1 | 7/2002 | Haverstick |
| 6,456,042 B1 | 9/2002 | Kwok |
| 6,495,992 B1 | 12/2002 | Pavlovic |
| 6,617,078 B1 | 9/2003 | Chia et al. |
| 6,636,020 B1 | 10/2003 | Ronald |
| 6,744,238 B2 | 6/2004 | Davis et al. |
| 6,765,389 B1 | 7/2004 | Moore |
| 7,005,830 B2 | 2/2006 | Moore et al. |
| 7,619,417 B2 | 11/2009 | Klang |
| 2004/0012369 A1 | 1/2004 | Moore et al. |
| 2005/0194936 A1 | 8/2005 | Cho |
| 2007/0001679 A1 | 1/2007 | Cho |
| 2008/0157777 A1* | 7/2008 | Yamabe .................. 324/426 |
| 2008/0204031 A1 | 8/2008 | Iwane et al. |
| 2009/0027056 A1* | 1/2009 | Huang ............. B60L 11/1857 324/439 |
| 2009/0108803 A1* | 4/2009 | Singarajan ........ B60L 11/1868 320/105 |
| 2009/0326842 A1* | 12/2009 | Thomas-Alyea .... G01R 31/362 702/64 |
| 2010/0036626 A1* | 2/2010 | Kang et al. ...................... 702/63 |
| 2011/0071706 A1* | 3/2011 | Crumm ................ B64C 39/024 701/3 |
| 2011/0214930 A1* | 9/2011 | Betts ...................... B60L 11/18 180/65.1 |

FOREIGN PATENT DOCUMENTS

| | | |
|---|---|---|
| CN | 101688899 | 3/2010 |
| JP | 2008-180692 | 8/2008 |
| KR | 10-2001-0043872 | 5/2001 |
| RU | 2328753 | 7/2008 |
| WO | 2007/032382 | 3/2007 |

OTHER PUBLICATIONS

First Office Action and Search Report in Chinese Patent Application 201180020352.8, together with the English translation thereof, dated Jun. 4, 2014, 16 pages.

Notice of Preliminary Rejection issued in corresponding Korean Application No. 10-2012-7029222, dated May 18, 2017.

Decision to Grant issued in corresponding Russian Application No. 2012149754, dated Apr. 9, 2015.

* cited by examiner

MONITORING BATTERY STATE OF CHARGE

CROSS-REFERENCE TO RELATED APPLICATIONS

This application is a national stage of PCT Patent Application Serial No. PCT/US2011/033582, filed on Apr. 22, 2011, which claims the benefit of U.S. Application No. 61/326,881 filed on Apr. 22, 2010, the disclosures of which are expressly incorporated herein by reference.

FIELD

The present invention relates to monitoring battery state of charge, and more specifically to systems and methods for real-time monitoring of battery state of charge.

BACKGROUND

The accurate monitoring of a battery system state of charge (SOC) is a common issue in battery applications. There are four main methods for monitoring SOC. One method is to determine SOC by dividing the charge left in battery system divided by the full charge capacity of the battery system. However, it is generally non-trivial to measure the charge left in the battery system directly, especially in a dynamic environment. An alternate form of this first method is to calculate the integral of current over time as the charge in the battery system changes. However, in such a method, the current sensor tolerance is generally limited and errors will typically accumulate. Further, the initial SOC, full charge capacity, and the battery efficiencies during charge and discharge cycles are difficult to obtain. Additionally, using such a method becomes extremely difficult in circumstances where charging and discharging occur randomly, as in hybrid electric vehicles, or where there are no clear charge/discharge cycles.

A second method is to use the relation of electric motive force (EMF) and SOC of a battery system. That is, using EMF to decide SOC, since EMF and SOC have a monotonic relationship in many types of battery systems. In particular, this method relies on using the open circuit voltage (OCV) as the EMF. However, due to the capacitance in a battery, it can take several hours of relaxing (i.e., zero current draw) to let OCV approach EMF, rendering such a method unsuitable for real-time monitoring.

A third method is to use the first method to estimate SOC and use the second method to adjust the estimate of SOC. However, since such a method still relies on OCV, it is generally difficult to provide a period of operational time with zero current to provide an accurate measure of EMF, resulting in inaccurate measurement of SOC.

The fourth method is Extended Kalman Filter Method. This method requires an extensive calculation on micro controller, which is a bottle neck for small micro controller chips.

SUMMARY

In an exemplary embodiment of the present disclosure, systems and methods for monitoring a state of charge of a battery are disclosed.

In another exemplary embodiment of the present disclosure, a method for monitoring a state-of-charge (SOC) for a battery connected to a load is provided. The method comprising determining with an electronic controller an estimation of the SOC of the battery; measuring a terminal voltage of the battery; measuring a current of the battery; and determining with an electronic controller a first value of at least one battery parameter from a database including a plurality of values of the at least one battery parameter. The first value of the at least one battery parameter being based on the estimation of the SOC of the battery. The method further comprising determining with the electronic controller a calculated terminal voltage of the battery; and determining with the electronic controller an updated estimation of the SOC of the battery based at least on the first value of the at least one battery parameter, the measured terminal voltage, and the calculated terminal voltage.

In a further exemplary embodiment of the present disclosure, a system for monitoring a state-of-charge (SOC) of a battery system connected to a load is provided. The system comprising at least one measurement element configured for measuring a terminal voltage and a current of said battery system during a sample time and a storage element configured for storing at least an estimation of the SOC of the battery, the measured terminal voltage of the battery, the measured current of the battery, and a plurality of values of at least one battery parameter. The plurality of values of the at least one battery parameter being based related to a plurality of values of the SOC of the battery. The system further comprising a processing element operatively coupled to said measurement element and said storage element. The processing element configured to determine a calculated terminal voltage of the battery; and determine an updated estimation of the SOC of the battery based at least on a first value of the plurality of values of the at least one battery parameter, the measured terminal voltage, and the calculated terminal voltage. The first value corresponding to the estimation of the SOC of the battery.

In yet another exemplary embodiment of the present disclosure, a computer readable medium including a plurality of instructions related to monitoring a state-of-charge (SOC) for a battery connected to a load is provided. The plurality of instructions being executable by an electronic controller to perform the steps of determining an estimation of the SOC of the battery; determining a first value of at least one battery parameter from a database including a plurality of values of the at least one battery parameter, the first value of the at least one battery parameter being based on the estimation of the SOC of the battery; determining a calculated terminal voltage of the battery; and determining an updated estimation of the SOC of the battery based at least on the first value of the at least one battery parameter, a measured terminal voltage, and the calculated terminal voltage.

In still another exemplary embodiment of the present disclosure, a method for monitoring a state-of-charge (SOC) for a battery connected to a load is provided. The method comprising: measuring a terminal voltage and a charge/discharge (CD) current of said battery; providing a plurality of pre-defined battery parameters associated with a plurality of SOC values; computing a calculated terminal voltage based on a stored polarization value, a stored hysteresis value, and said plurality of pre-defined parameters associated with a stored SOC value; and calculating a updated SOC value based on said measured terminal voltage, said calculated terminal voltage value, said CD current, and a predefined gain value associated with said stored SOC value.

In still a further exemplary embodiment of the present disclosure, a system for monitoring a state-of-charge (SOC) of a battery system connected to a load is provided. The system comprising at least one measurement element configured for measuring a terminal voltage and a charge/discharge (CD) current of said battery system during a sample time; a storage element configured for storing at least a previous SOC value, a plurality of pre-defined battery parameters associated with a plurality of SOC values, and a plurality of pre-defined gain values associated with said plurality of SOC values; a processing element communicatively coupled to said measurement element and said storage element. The processing element configured for computing a calculated terminal voltage based on a stored polarization value, a stored hysteresis value, and said plurality of pre-defined parameters associated with a stored SOC value, and calculating a updated SOC value based on said measured terminal voltage, said calculated terminal voltage value, said CD current, and a one of said plurality of pre-defined gain values associated with said stored SOC value.

In yet a further exemplary embodiment of the present disclosure, a computer-readable storage medium, having stored thereon a computer program for monitoring a state-of-charge (SOC) of a battery connected to a load, is provided. The computer program comprising a plurality of instructions executable by a computer. The plurality of instructions comprising code sections for performing the steps of accessing a plurality of pre-defined battery parameters and a plurality of pre-defined gain values for a plurality of SOC values; measuring a terminal voltage and a charge/discharge (CD) current of said battery; calculating updated terminal voltage, polarization, and hysteresis values for said battery based on said discharge current, a stored polarization value, a stored hysteresis value, and a portion of said plurality of parameters associated with a stored SOC value; generating an adjusted SOC value based on said obtained terminal voltage, said updated terminal voltage value, and one of said plurality of gain values associated with said stored SOC value; and computing an updated SOC value based on said adjusted SOC value.

In still a further exemplary embodiment of the present disclosure, a battery assembly is provided. The battery system comprising a battery system comprising at least one battery cell; and a monitoring system for monitoring a state of charge (SOC) of the battery system. The monitoring system comprises at least one measurement element configured for measuring a terminal voltage and a charge/discharge (CD) current of said battery system during a sample time; a storage element configured for storing at least a previous SOC value, a plurality of pre-defined battery parameters associated with a plurality of SOC values, and a plurality of pre-defined gain values associated with said plurality of SOC values; and a processing element configured for computing a calculated terminal voltage based on a stored polarization value, a stored hysteresis value, and said plurality of pre-defined parameters associated with a stored SOC value, and calculating a updated SOC value based on said measured terminal voltage, said calculated terminal voltage value, said CD current, and a one of said plurality of pre-defined gain values associated with said stored SOC value.

In still yet a further exemplary embodiment of the present disclosure, a system is provided. The system comprising a battery system comprising at least one battery cell; a load electrically coupled to said battery system; and a monitoring system for monitoring a state of charge (SOC) of the battery system. The monitoring system comprises at least one measurement element configured for measuring a terminal voltage and a charge/discharge (CD) current of said battery system during a sample time; a storage element configured for storing at least a previous SOC value, a plurality of pre-defined battery parameters associated with a plurality of SOC values, and a plurality of pre-defined gain values associated with said plurality of SOC values; and a processing element configured for computing a calculated terminal voltage based on a stored polarization value, a stored hysteresis value, and said plurality of pre-defined parameters associated with a stored SOC value, and calculating a updated SOC value based on said measured terminal voltage, said calculated terminal voltage value, said CD current, and a one of said plurality of pre-defined gain values associated with said stored SOC value.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION OF THE DRAWINGS

The embodiments disclosed herein are not intended to be exhaustive or to limit the invention to the precise forms disclosed in the following detailed description. Rather, the embodiments are chosen and described so that others skilled in the art may utilize their teachings. While the present invention primarily involves the monitoring of the state of charge of batteries for a vehicle or energy grid storage system, it should be understood, that the invention may have application for batteries which provide power to other devices.

The present invention is not limited by the illustrated ordering of acts or events, as some acts may occur in different orders and/or concurrently with other acts or events. Furthermore, not all illustrated acts or events are required to implement a methodology in accordance with the present invention.

Kalman filter-based methods for control and monitoring of systems are based on a form of feedback control. First, the filter estimates the state of the system at a first time and then obtains feedback in the form of some type of measurements. Thus, Kalman filter methods rely on projecting a current state estimate ahead in time and adjusting the projected estimate using actual measurements at that time. In order to provide adjustments for the projected estimate, Kalman filter methods require several matrix calculations (operations) including predict a state (vector), predict estimate covariance(matrix), update measurement residual(matrix), update covariance(matrix), calculate gain matrix, update state estimate(vector), update estimate covariance(matrix), calculation in iteration. In general, these computations include the determination of inverse matrix. As a result, a conventional Kalman filter method is commonly computationally intensive and prone to failure due to ill conditions in the matrices and/or divergence during the various iterations.

Figure 1:
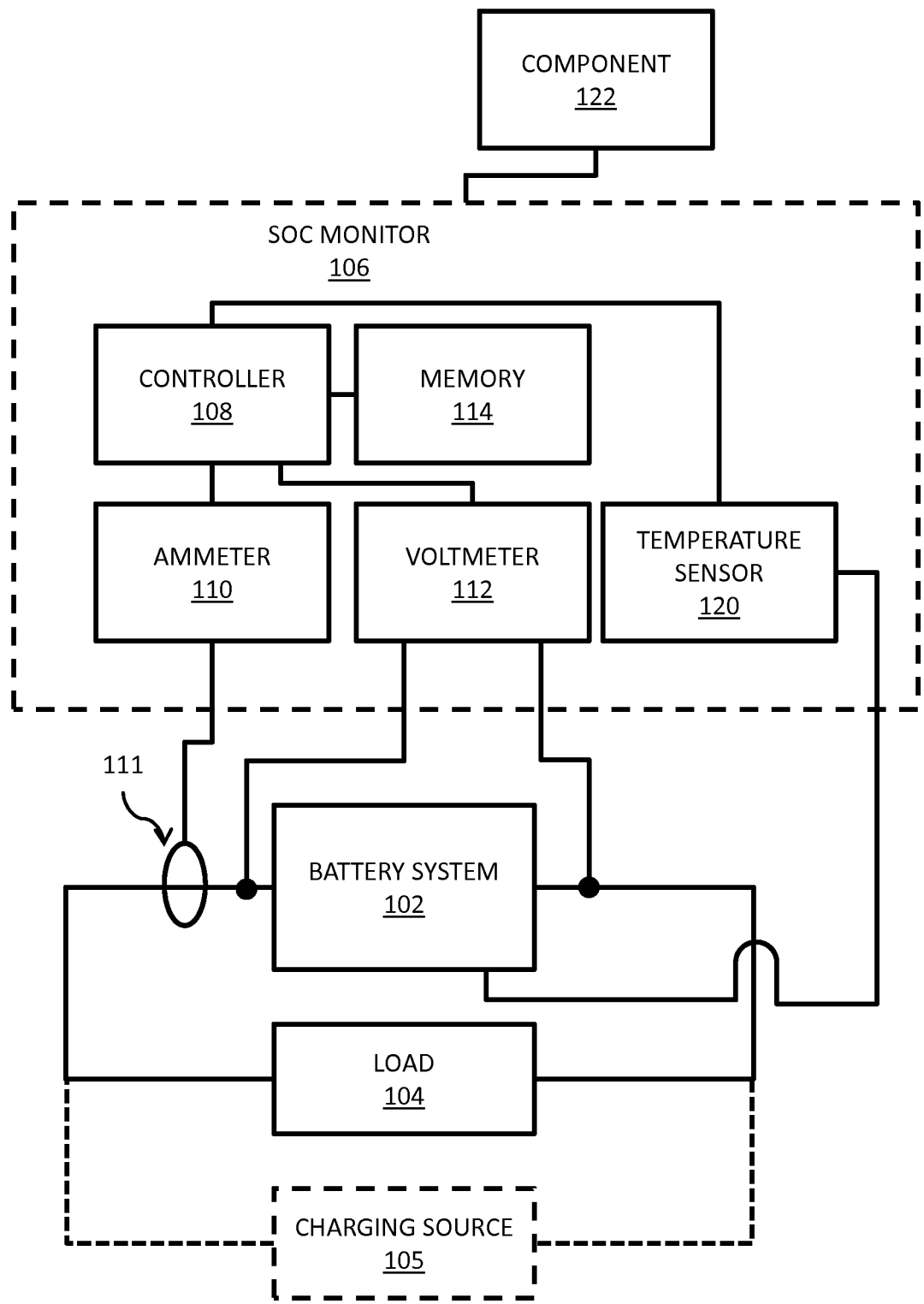
FIG. 1 illustrates a representative view of a battery-operated system including SOC monitoring of a battery by an exemplary SOC monitor.
Figure 2:
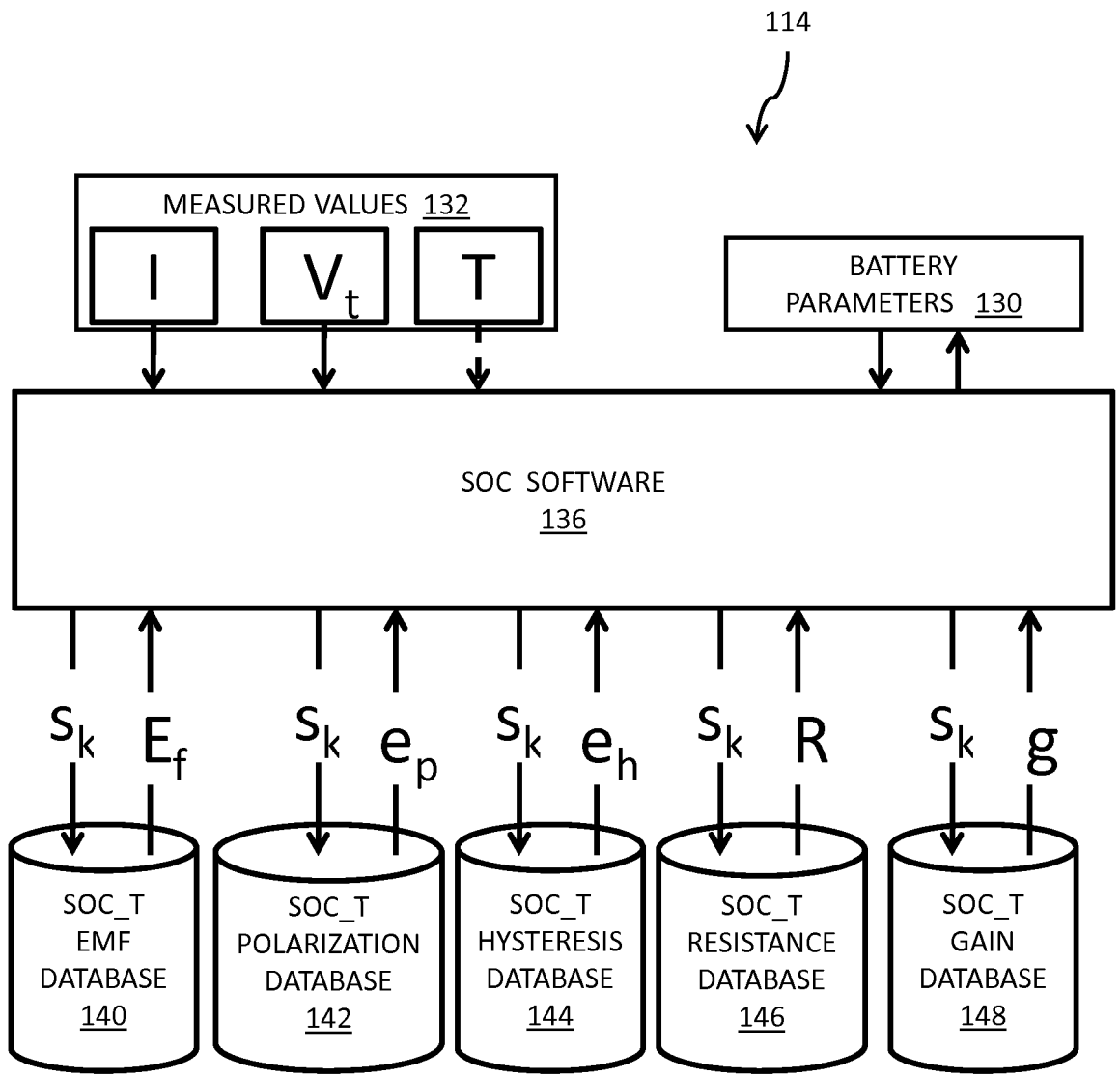
FIG. 2 illustrates a representative view of exemplary data stored on an exemplary memory of the SOC monitor of FIG. 1.

As described herein, one or more reference tables, see databases 140-148 in FIG. 2, are provided to reduce the computational requirements related to determining the SOC of a battery system while still implementing the principles of Kalman filtering. For instance, the gain matrix calculation step is replaced by a lookup step, reducing the computing requirements for using a Kalman filter-based method for monitoring SOC. Thus, SOC may be accurately monitored on a larger number of devices, including devices with limited computational power, such as portable device. However, such SOC monitoring in accordance with the processing sequences disclosed herein is not limited to use in solely portable devices. Rather, any type of battery operated devices may be adapted to perform such SOC monitoring. For example, the processing sequences disclosed herein may be used in any dynamic environment, such as portable and non-portable electronic devices, electric vehicles (hybrid and non-hybrid), non-electric vehicles, power generation devices, power distribution devices, and other suitable devices. A schematic of such a device is shown in FIG. 1.

FIG. 1 is a block diagram of an exemplary system 100 configured for SOC monitoring. Although FIG. 1 shows an exemplary architecture for a system including SOC monitoring, other configurations and architectures may be used. For example, a system may be provided with more or less components than shown in FIG. 1. Further, one or more components shown in FIG. 1 may also be combined. Additionally, one or more of the components in FIG. 1 may be locally or remotely located with respect to a battery in system 100.

As shown in FIG. 1, system 100 includes a battery 102 and a load 104 for drawing power from the battery 102. Alternatively, system 100 can also include a power source 104 for charging battery 102. As used herein, the term "battery" or "battery system" refers to any combination of one or more electrochemical cells configured to convert stored chemical energy into electrical energy. In one embodiment, system 100 may also include a power supply or source 105 for providing a current to load 104 and/or for recharging battery 102. For example, source 105 may comprise an alternator, a generator, or any other device for generating electrical current. In some cases, the source 105 may be configured to provide a charging current to battery 102 to reduce the amount of damage to battery 102 during charging. Such configurations are well-known to those of ordinary skill in the art and will not be described herein.

System 100 further includes a SOC monitor 106 for monitoring the SOC of battery 102. As shown in FIG. 1, SOC monitor 106 may include a current measuring device or ammeter 110 for determining a current (I) during charging or discharging of battery 102. Although shown in FIG. 1 as inductively determining the current with a coil 111, other suitable devices may be used to monitor the current. In one embodiment, a sense resistor configuration may be used to determine the current. In one embodiment, current measuring device 110 provides an indication of the current to a controller 108 of SOC monitor 106. SOC monitor 106 may also include a voltage measuring device or voltmeter 112 for determining a terminal voltage ($V_t$) of the battery. In one embodiment, voltage measuring device 112 provides an indication of the voltage to a controller 108 of SOC monitor 106. The output of current measuring device 110 and voltage measuring device 112 may then be provided to controller 108. Controller 108 is configured to compute the SOC based on these measured values and values stored in a memory element 114 of SOC monitor 106. This will be described in greater detail below with respect to FIGS. 4 and 5. One or more signals indicative of the current SOC may then be output to another component 122. For example, the signals may be output to a display (or other user interface) or any other component for storing, transmitting, or displaying an indication of the SOC. In one embodiment, a temperature associated with battery 102 is also monitored by one or more temperature sensors 120 which provide an indication of the temperature of the battery 102. The temperature sensors 120 may monitor a temperature of the battery 102, a temperature of a region proximate to the battery 102, or a combination thereof.

As described above, memory 114 is configured to store various values. Referring to FIG. 2, memory 114 stores one or more battery parameters 130. Battery parameters 130 may include constants, computed values, and other suitable values needed to determine the SOC of battery 102. Exemplary constant values include the full charge capacity of the battery (Q), a polarization decay constant (K), charge/discharge efficiency ($\gamma$), and a hysteresis decay constant ($\mu$). Depending on the type of battery, separate values for discharge efficiency and charge efficiency may be specified.

In addition, memory 114 stores various measured values 132. Exemplary measured values include a charge or discharge current (I) of the battery, a terminal voltage ($V_t$) of the battery, and a temperature (T) associated with the battery. Memory 114 further includes one or more databases which provide additional battery parameters based on the current SOC ($S_k$) value associated with the battery or based on the current SOC ($S_k$) value associated with the battery and the temperature (T) associated with the battery. Exemplary database arrangements include an array of values, a look-up table, and other suitable arrangements for organizing data.

In an exemplary embodiment, memory 114 includes a SOC_T_EMF database 140, a SOC_T_POLARIZATION database 142, a SOC_T_HYSTERESIS database 144, a SOC_T_RESISTANCE database 146, and a SOC_T_GAIN database 148. Databases 140-148 are queried or otherwise accessed by SOC software 136 of the SOC monitor 106 as described herein in relation to the processing sequences of FIGS. 4 and 5. The SOC_T_EMF database 140 includes a plurality of values of the EMF ($E_f$) of the battery, each corresponding to a SOC value ($S_k$) and a temperature value (T). SOC software 136 queries SOC_T_EMF database 140 with a given value for ($S_k$) and a given temperature value (T) and is returned a corresponding value for the EMF ($E_f$) of the battery. The SOC_T_POLARIZATION database 142 includes a plurality of values of the polarization coefficient ($e_p$) for the battery, each corresponding to a SOC value ($S_k$) and a temperature value (T). SOC software 136 queries SOC_T_POLARIZATION database 142 with a given value for ($S_k$) and a given temperature value (T) and is returned a corresponding value for the polarization coefficient ($e_p$) for the battery. The SOC_T_HYSTERESIS database 144 includes a plurality of values of the hysteresis coefficient ($e_h$) for the battery, each corresponding to a SOC value ($S_k$) and a temperature value (T). SOC software 136 queries SOC_T_HYSTERESIS database 144 with a given value for ($S_k$) and a given temperature value (T) and is returned a corresponding value for the hysteresis coefficient ($e_h$) for the battery. The SOC_T_RESISTANCE database 146 includes a plurality of values of the internal battery resistance (R) for the battery, each corresponding to a SOC value ($S_k$) and a temperature value (T). SOC software 136 queries SOC_T_RESISTANCE database 146 with a given value for ($S_k$) and a given temperature value (T) and is returned a corresponding value for the internal battery resistance (R) for the battery. The SOC_T_GAIN database 148 includes a plurality of values of the SOC gain coefficient (g) for the battery, each corresponding to a SOC value ($S_k$) and a temperature value (T). SOC software 136 queries SOC_T_GAIN database 148 with a given value for ($S_k$) and a given temperature value (T) and is returned a corresponding value for the SOC gain coefficient (g) for the battery. The values in databases 140-148 may be derived experimentally and/or analytically. Memory 114 may operate as working memory for the system. That is, past, current, and future values for SOC, I, $V_t$, and other values of interest, including intermediate values or results, may be stored in memory 114. Use of the values in memory 114 will be described in greater detail with respect to FIGS. 4 and 5. One or more of databases 140-148 may return their respective values based on a given value for ($S_k$) independent of temperature.

Figure 3:
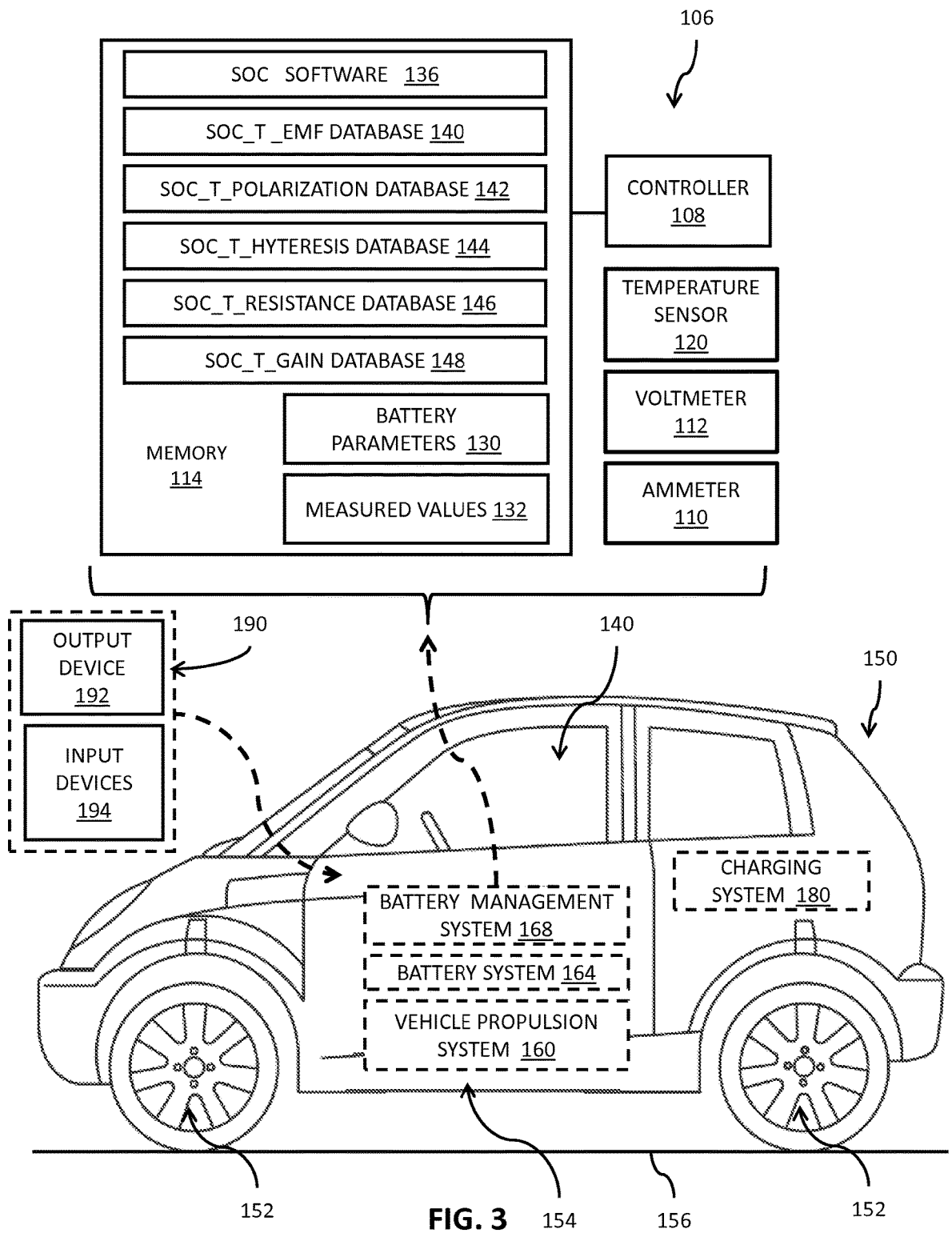
FIG. 3 illustrates an exemplary vehicle.

Referring to FIG. 3, an exemplary vehicle 150 is shown. Vehicle 150 includes a plurality of ground engaging members 152, illustratively wheels and associated tires. A frame 154 of vehicle 150 is supported above the ground 156 by the ground engaging members 152. A vehicle propulsion system 160 is also supported by ground engaging members 152 and is operatively coupled to at least one of ground engaging members 152 to power the movement of vehicle 150 relative to ground 156. Vehicle propulsion system 160 may be supported by frame 154.

In one embodiment, the vehicle propulsion system 160 includes an electric motor which receives electrical energy from a battery system 164 over a vehicle propulsion bus. The electric motor is operatively coupled to one or more ground engaging members 152 through a power transfer system. Exemplary power transfer systems include transmissions and drive shafts. Battery system 164 includes a plurality of batteries, such as represented by battery 102 in FIG. 1. Exemplary batteries 102 include lithium ion batteries, lead acid batteries, NiCd batteries, NiMH batteries, molten salt batteries, and other suitable battery chemistries. An exemplary molten salt battery is the ZEBRA brand battery available from FZ SoNick located at Via Laveggio, 15 6855 Stabio in Switzerland. In one embodiment, the plurality of batteries 102 are provided in one or more battery packs or assemblies. Exemplary batteries and battery assemblies are provided in US Published Patent Application No. US20080193830A1, filed Apr. 16, 2008, titled BATTERY ASSEMBLY WITH TEMPERATURE CONTROL DEVICE; US Published Patent Application No. US20080226969A1, filed Mar. 13, 2008, titled BATTERY PACK ASSEMBLY WITH INTEGRATED HEATER; US Published Patent Application No. US20080299448A1, filed Nov. 2, 2007, titled BATTERY UNIT WITH TEMPERATURE CONTROL DEVICE; and US Published Patent Application No. US20100273042A1, filed Mar. 13, 2008, titled BATTERY ASSEMBLY WITH TEMPERATURE CONTROL DEVICE, the disclosures of which are expressly incorporated by reference herein in their entirety.

In the illustrated embodiment, battery system 164 provides at least a portion of the motive power for vehicle 150. In one embodiment, vehicle propulsion system 160 converts the power provided by batteries 102 to AC to drive an AC electric motor. In one example, battery system 164 provides at least about 200 V to vehicle propulsion system 160. In one example, battery system 164 provides up to about 400 V to vehicle propulsion system 160. In one example, battery system 164 provides in the range of about 240 V to about 400 V to vehicle propulsion system 160.

Vehicle 150 further includes a battery management system 168 which monitors the battery system 164 and controls the operation of the battery system 164. In one embodiment, the SOC monitor 106 is a part of the battery management system 168. In one embodiment, the SOC monitor 106 is separate from and communicates with the battery management system 168.

Vehicle 150 further includes a charging system 180 which provides a charge current to battery system 164. Exemplary charging systems include a generator, a plug-in connection, and other suitable devices for charging battery system 164.

As mentioned in connection with FIG. 1, SOC monitor 106 may communicate an indication of the SOC of the battery to a remote component 122. In the illustrated example of FIG. 3, the remote component is a user interface 190 of vehicle 150. User interface 190 includes one or more input devices 194 and one or more output devices 192. Exemplary output devices include gauges, displays, lights, and other suitable devices for communicating an indication of the SOC to an operator of vehicle 150. Exemplary input devices 194 include buttons, dials, switches, a touch screen, and other suitable devices for receiving an input from an operator of vehicle 150. In one embodiment, the indication of the SOC is provided by one or more output devices 192 automatically. In one embodiment, the indication of the SOC is provided by one or more output devices 192 in response to an input received by at least one of the input devices 194.

Figure 4:
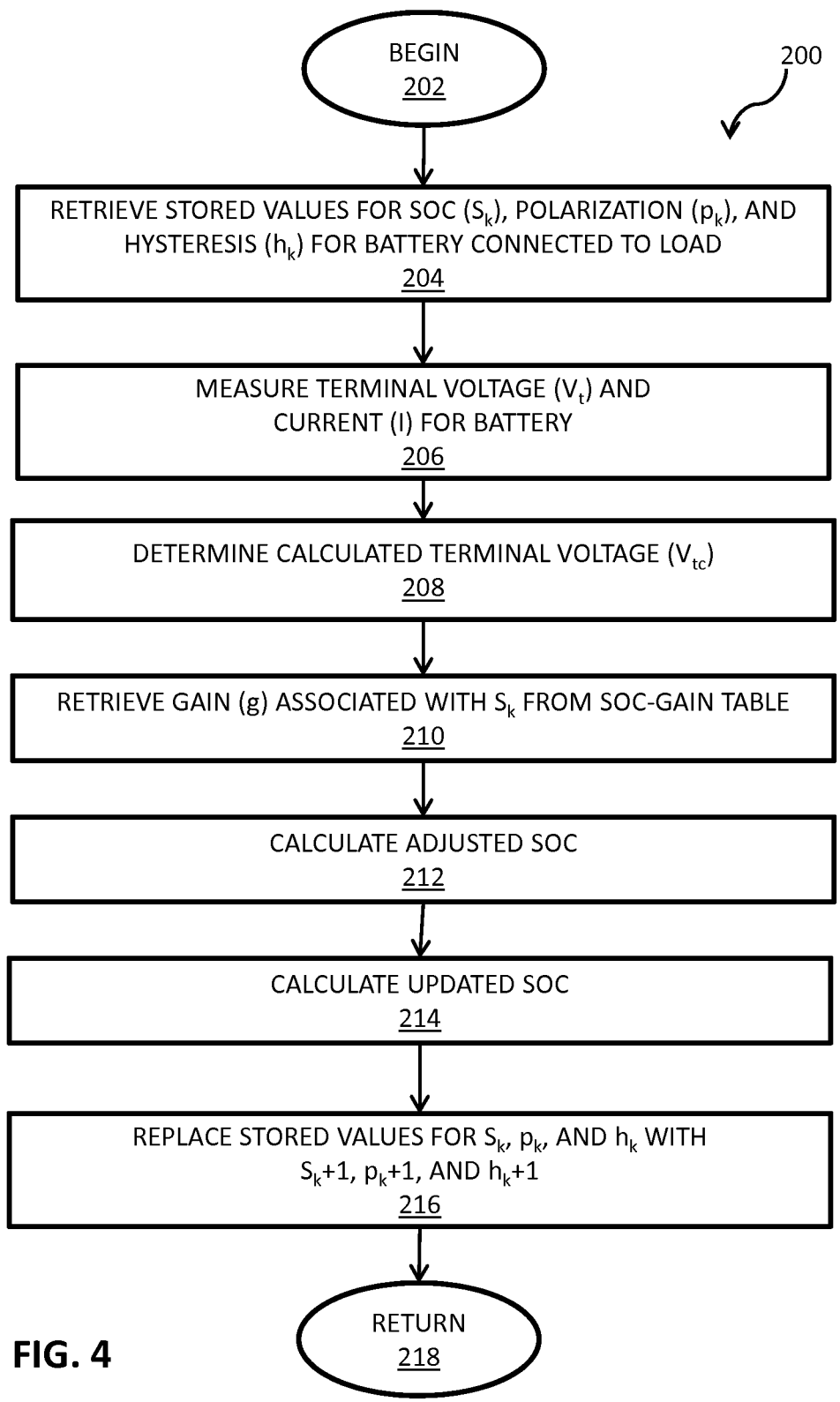
FIG. 4 illustrates an exemplary processing sequence of the SOC monitor of FIG. 1.

Referring to FIG. 4, an exemplary processing sequence 200 of SOC monitor 106 is shown. The processing sequence 200 begins, as represented by block 202. In one embodiment, the processing sequence 200 begins when load 104 begins to draw energy from battery 102. In the case of a vehicle, the processing sequence 200 may begin at a key on of the vehicle. As represented by block 204, stored values for SOC ($S_k$), polarization ($p_k$), and hysteresis ($h_k$) are retrieved or values are determined. These stored values may be some previously determined values for these parameters. For example, these values may be retrieved from a database of values. An initial or default value may be selected for the current SOC ($S_k$), polarization ($p_k$), and hysteresis ($h_k$). For example, a suitable set of values can specify an initial SOC value ($S_k$) is equal to about 0.7, an initial polarization value ($p_k$) is equal to about 0, and an initial hysteresis value ($h_k$) is equal to about 0. In one embodiment, the initial SOC value ($S_k$) is equal to the last stored SOC value. In the case of a vehicle 150, the last stored SOC value was the SOC value at key off.

The terminal voltage ($V_t$) and the discharge current (I) for the battery 102 are measured, as represented by block 206. In the illustrated embodiment of FIG. 1, as battery 102 discharges to load 104 (or is charged by source 105), measurements for $V_t$ and I are obtained by components 112 and 110, respectively.

After the initial values of ($S_k$, $p_k$, and $h_k$) and values for $V_t$ and I are determined, additional parameters may be determined, as represented by block 208. In one embodiment, a calculated terminal voltage ($V_{tc}$) is determined. The difference in the calculated terminal voltage ($V_{tc}$) and the measured terminal voltage ($V_t$) may then be used to adjust the value of the SOC as discussed herein. An exemplary processing sequence for determining a calculated terminal voltage ($V_{tc}$) is illustrated in FIG. 5 and described herein.

Figure 5:
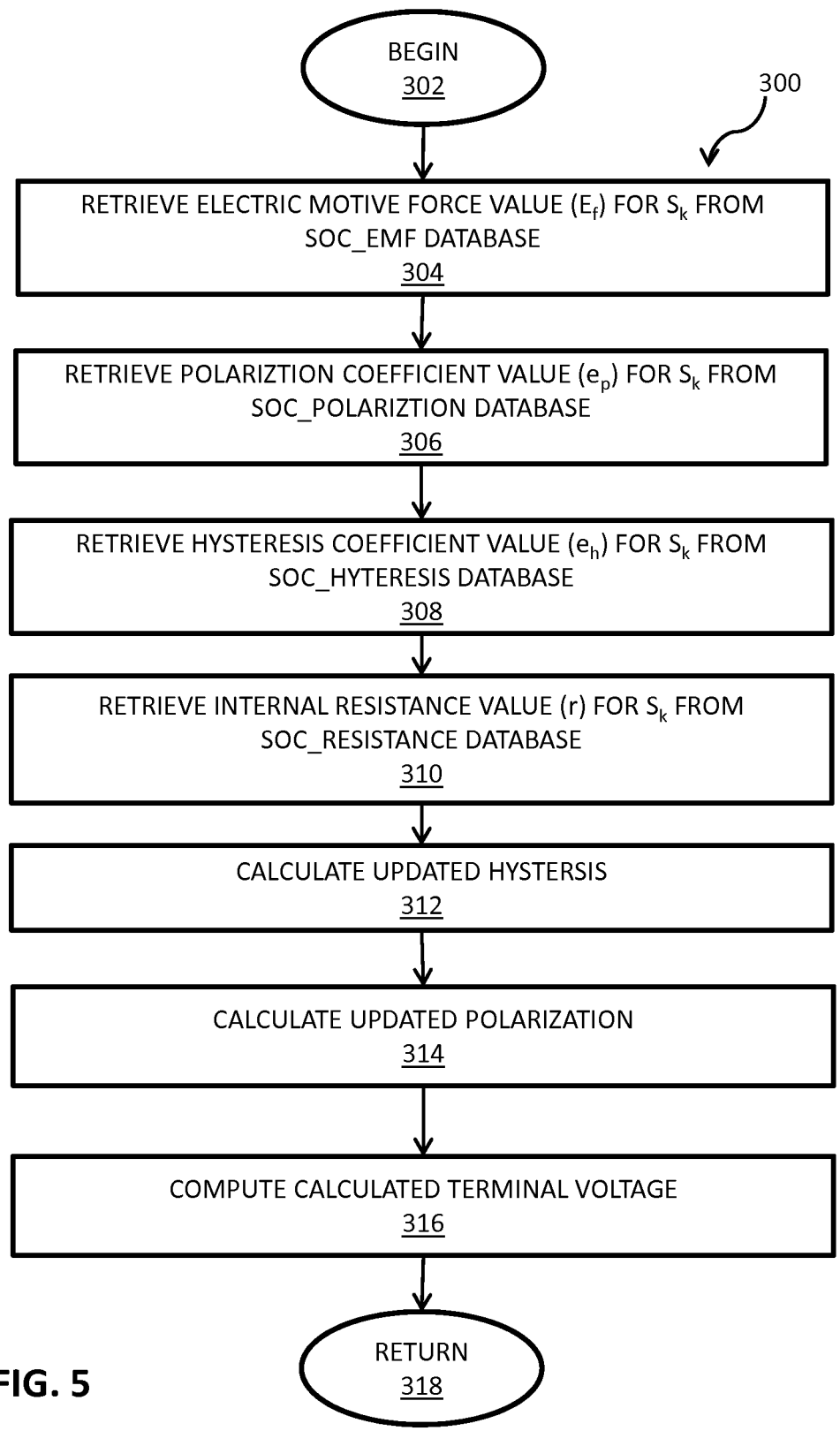
FIG. 5 illustrates an exemplary processing sequence of the SOC monitor of FIG. 1.

Referring to FIG. 5, an exemplary processing sequence 300 is illustrated. Processing sequence 300 based on the value of $S_k$ determines a value for each of the electric motive force or EMF ($E_f$), a polarization coefficient ($e_p$), a hysteresis coefficient ($e_h$), an internal resistance of the battery (R), and an SOC gain coefficient (g). The EMF value ($E_f$) for the stored SOC ($S_k$) is retrieved by controller 108, as represented by block 304 and as illustrated in FIG. 2. In one embodiment, controller 108 may access a table in memory 114 including values of $E_f$ as a function of SOC and battery temperature (e.g. SOC_T_EMF), and retrieve the value of $E_f$ corresponding to an SOC value equal to $S_k$ and a temperature value equal to T. In one embodiment, controller 108 may access a table in memory 114 including values of $E_f$ as a function of SOC and retrieve the value of $E_f$ corresponding to an SOC value equal to $S_k$.

The polarization coefficient value ($e_p$) for the stored SOC ($S_k$) is retrieved by controller 108, as represented by block 306 and as illustrated in FIG. 2. In one embodiment, controller 108 may access a table in memory 114 including values of $e_p$ as a function of SOC and battery temperature (e.g. SOC_T_POLARIZATION), and retrieve the value of $e_p$ corresponding to an SOC value equal to $S_k$ and a temperature value equal to T. In one embodiment, controller 108 may access a table in memory 114 including values of $e_p$ as a function of SOC and retrieve the value of $e_p$ corresponding to an SOC value equal to $S_k$.

The hysteresis coefficient value ($e_h$) for the stored SOC ($S_k$)) is retrieved by controller 108, as represented by block 308 and as illustrated in FIG. 2. In one embodiment, controller 108 may access a table in memory 114 including values of $e_h$ as a function of SOC and battery temperature (e.g. SOC_T_HYSTERESIS) and retrieve the value of $e_h$ corresponding to an SOC value equal to $S_k$ and a temperature value equal to T. In one embodiment, controller 108 may access a table in memory 114 including values of $e_h$ as a function of SOC and retrieve the value of $e_h$ corresponding to an SOC value equal to $S_k$.

The internal resistance value (R) for the stored SOC ($S_k$)) is retrieved by controller 108, as represented by block 310 and as illustrated in FIG. 2. In one embodiment, controller 108 may access a table in memory 114 including values of R as a function of SOC and battery temperature (e.g. SOC_T_RESISTANCE), and retrieve the value of R corresponding to an SOC value equal to $S_k$ and a temperature value equal to T. In one embodiment, controller 108 may access a table in memory 114 including values of R as a function of SOC and retrieve the value of R corresponding to an SOC value equal to $S_k$ and temperature.

The values for the databases accessed by controller 108, as represented by blocks 304-310, may be generated analytically or experimentally. Further, the databases may be stored locally with controller 108 or remotely and accessible by controller 108 over a network.

In some instances the SOC value of $S_k$ may not correspond to an SOC value in one or more of databases 140-148. In this case, in one embodiment, controller 108 selects a value for the parameter to be returned based on one or more values of SOC provided in the respective database. For example, a value may be selected by interpolation, based on $S_k$ and the SOC values in the table and their corresponding values for the parameter to be returned. Alternatively, a value may be selected by rounding $S_k$ to a next tabulated value and retrieving the corresponding value. In yet another method, a proximity method can be used. That is, a value associated with an SOC value closest to $S_k$ may be used. Other exemplary methods may be used to determine values based on the value of $S_k$. The same interpolation and other exemplary methods apply to the stored temperature values as well.

As represented by block 312, an updated hysteresis value ($h_{k+1}$) is determined by controller 108. In one embodiment, an updated hysteresis value ($h_{k+1}$) is determined in accordance with equation 1:

$$h_{k+1} = e_h \text{sign}(I)(1-e^{-|\mu I \delta t|}) + h_k e^{-|\mu I \delta t|} \quad (1)$$

wherein $h_{k+1}$ is the hysteresis value at $(k+1)^{th}$ iteration, $e_h$ is the hysteresis coefficient, I is the current (positive when charge, negative when discharge), $\mu$ is the hysteresis decay constant, $\delta t$ is the sampling time, $h_k$ is the hysteresis value at $k^{th}$ iteration, and sign( ) is the sign function which is 1 when the value of I is greater than zero, −1 when the value of I is less than zero, 0 when I is zero.

As represented by block 314, an updated polarization value ($p_{k+1}$) is determined by controller 108. In one embodiment, an updated polarization value ($p_{k-1}$) is determined in accordance with either equation 2 or equation 3 depending on a value of the measured current (I).

$$p_{k+1} = e_p \text{sign}(I)(1-e^{-K\delta t}) + p_k e^{-K\delta t} \text{ for } I > currentlimit1 \quad (2)$$

$$p_{k+1} p_k e^{-K\delta t} \text{ for } |I| \leq \text{current limit } 1 \quad (3)$$

wherein $p_{k+1}$ is the polarization value at $(k+1)^{th}$ iteration, $e_p$ is the polarization coefficient, I is the current (positive when charge, negative when discharge), K is the polarization decay constant, $\delta t$ is the sampling time, $p_k$ is the polarization value at $k^{th}$ iteration, and sign( ) is the sign function which is 1 when the value of I is greater than zero and −1 when the value of I is less than zero, 0 when I is zero. The current limit 1 is a fraction of the C-rate current of the battery. In one example the value of current limit 1 is about 2 percent of 1 C to about 3 percent of 1 C. For example, 1 C is 15 A for some batteries and the current limit 1 may be selected as 0.4 A. Under such current limit, the charge/discharge is very small and may be neglected.

As represented by block 314, a calculated terminal voltage ($V_{tc}$) is determined by controller 108. In one embodiment, a calculated terminal voltage ($V_{tc}$) is determined in accordance with equation 4:

$$V_{tc} = E_f + RI + h_k + p_k \quad (4)$$

wherein $V_{tc}$ is the calculated terminal voltage, $E_f$ is the electric motive force value, R is the internal resistance value, I is the current (positive when charge, negative when discharge), $h_k$ is the hysteresis value at $k^{th}$ iteration, and $p_k$ is the polarization value at $k^{th}$ iteration.

Returning to FIG. 4, based on the calculated terminal voltage ($V_{tc}$) and the measured terminal voltage ($V_t$) an updated value for the SOC may be determined. A SOC gain coefficient value (g) is retrieved by controller 108, as represented by block 210. In one embodiment, the SOC gain coefficient value (g) is retrieved by controller 108 from SOC_T_GAIN database 148. An adjusted SOC value ($S_{ka}$) may be determined, as represented by block 212. In one embodiment, an adjusted SOC value ($S_{ka}$) is determined in accordance with equation 5:

$$S_{ka} = S_k + g(V_t - V_{tc}) \quad (5)$$

wherein $S_{k+1}$ is the adjusted SOC value at $k^{th}$ iteration, $S_k$ is the SOC value at $k^{th}$ iteration, g is the SOC gain coefficient value, $V_t$ is the measured terminal voltage value, and $V_{tc}$ is the calculated terminal voltage value.

An updated SOC value ($S_{k+1}$) may be determined, as represented by block 214. In one embodiment, an updated SOC value ($S_{k+1}$) is determined in accordance with equation 6:

$$S_{k+1} = S_{ka} + \frac{\gamma I \delta t}{Q} \qquad (6)$$

wherein $S_{k+1}$ is the updated SOC value corresponding to the $(k+1)^{th}$ iteration, $S_{ka}$ is the adjusted SOC value at $k^{th}$ iteration, $\gamma$ is the efficiency value of charge and discharge (may be different during charge and discharge), I is the current value (positive when charge, negative when discharge), Q is the full charge capacity value of the battery system, and $\delta t$ is the sampling time interval.

Either $S_{k+1}$ or $S_{ka}$ may be reported by controller 108 as the SOC value. Controller 108 then stores the values for the k+1 iteration as the new k iteration values and determines the next values for the k+1 iteration.

Figure 6:
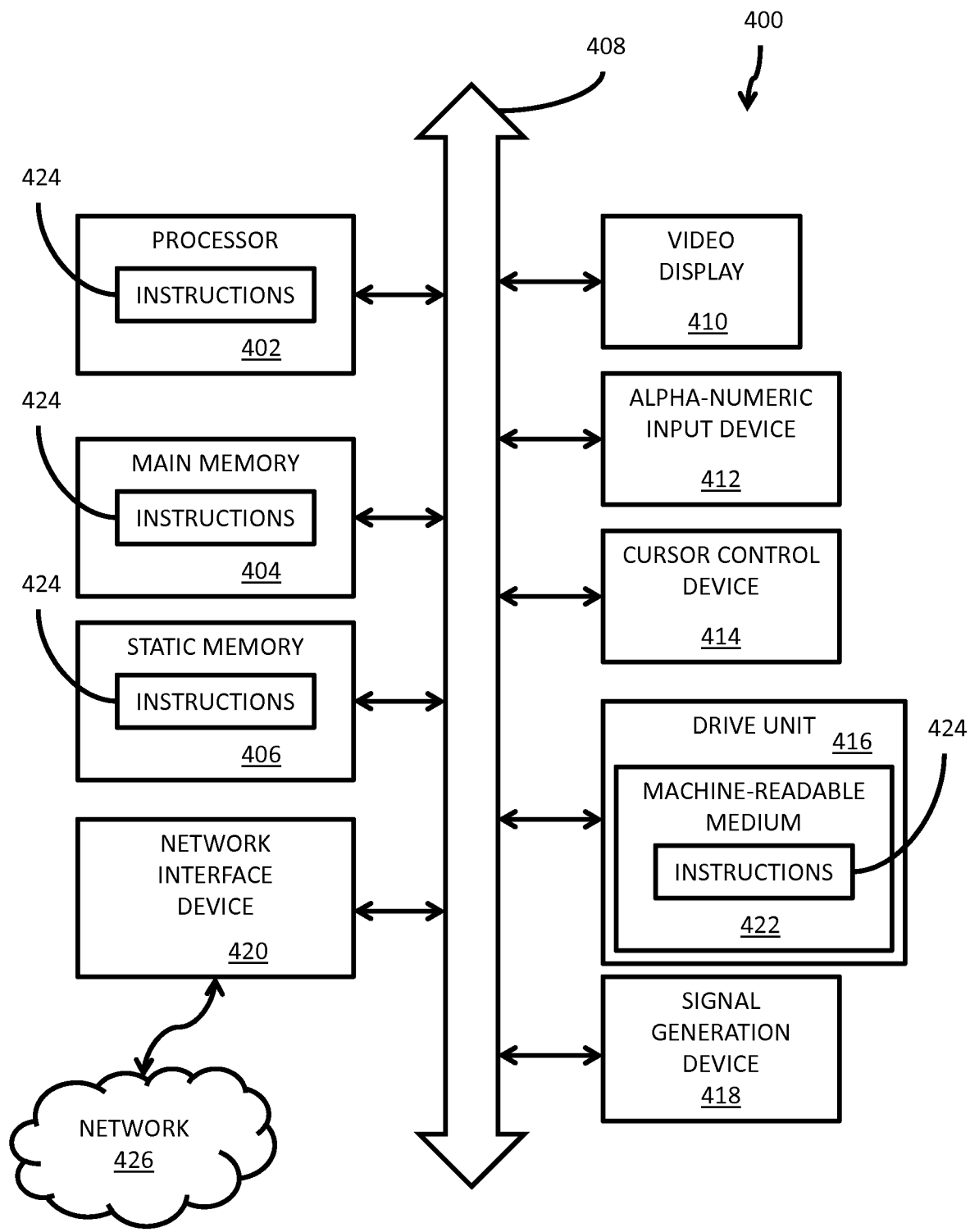
FIG. 6 illustrates a schematic diagram of an exemplary computer system for executing a set of instructions that, when executed, can cause the computer system to perform one or more methodologies and procedures of the systems described herein.

FIG. 6 is a schematic diagram of a computer system 400 for executing a set of instructions that, when executed, may cause the computer system to perform one or more of the methodologies, processing sequences, and procedures described above. In one embodiment, the computer system 400 operates as a standalone device. In one embodiment, the computer system 400 may be connected (e.g., using a network) to other computing devices. In a networked deployment, the computer system 400 may operate in the capacity of a server or a client machine in server-client network environment, or as a peer machine in a peer-to-peer (or distributed) network environment.

The machine may comprise various types of computing systems and devices, including a server computer, a client user computer, a personal computer (PC), a tablet PC, a laptop computer, a desktop computer, a control system, a network router, switch or bridge, or any other device capable of executing a set of instructions (sequential or otherwise) that specifies actions to be taken by that device. It is to be understood that a device of the present disclosure also includes any electronic device that provides voice, video or data communication. Further, while a single computer is illustrated, the phrase "computer system" shall be understood to include any collection of computing devices that individually or jointly execute a set (or multiple sets) of instructions to perform any one or more of the methodologies discussed herein.

The computer system 400 may include a processor 402 (such as a central processing unit (CPU), a graphics processing unit (GPU, or both), a main memory 404 and a static memory 406, which communicate with each other via a bus 408. The computer system 400 may further include a display unit 410, such as a video display (e.g., a liquid crystal display or LCD), a flat panel, a solid state display, or a cathode ray tube (CRT)). The computer system 400 may include an alphanumeric input device 412 (e.g., a keyboard), a cursor control device 414 (e.g., a mouse), a disk drive unit 416, a signal generation device 418 (e.g., a speaker or remote control) and a network interface device 420.

The disk drive unit 416 may include a computer-readable medium 422 on which is stored one or more sets of instructions 424 (e.g., software code) configured to implement one or more of the methodologies, procedures, or functions described herein. The instructions 424 may also reside, completely or at least partially, within the main memory 404, the static memory 406, and/or within the processor 402 during execution thereof by the computer system 400. The main memory 404 and the processor 402 also may constitute machine-readable media.

Dedicated hardware implementations including, but not limited to, application-specific integrated circuits, programmable logic arrays, and other hardware devices may likewise be constructed to implement the methods or processing sequences described herein. Applications that can include the apparatus and systems of the various embodiments disclosed herein broadly include a variety of electronic and computer systems. Some embodiments implement functions in two or more specific interconnected hardware modules or devices with related control and data signals communicated between and through the modules, or as portions of an application-specific integrated circuit. Thus, the exemplary system is applicable to software, firmware, and hardware implementations.

In accordance with various embodiments of the present disclosure, the methods described herein may be stored as software programs in a computer-readable medium and may be configured for running on a computer processor. Furthermore, software implementations may include, but are not limited to, distributed processing, component/object distributed processing, parallel processing, virtual machine processing, which may also be constructed to implement the methods described herein.

The present disclosure contemplates a computer-readable medium containing instructions 424 or that receives and executes instructions 424 from a propagated signal so that a device connected to a network environment 426 may send or receive data and that may communicate over the network 426 using the instructions 424. The instructions 424 may further be transmitted or received over a network 426 via the network interface device 420.

While the computer-readable medium 422 is shown in an exemplary embodiment to be a single storage medium, the term "computer-readable medium" should generally be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the machine and that cause the machine to perform any one or more of the methodologies of the present disclosure.

The term "computer-readable medium" shall accordingly be taken to include, but not be limited to, solid-state memories such as a memory card or other package that houses one or more read-only (non-volatile) memories, random access memories, or other re-writable (volatile) memories; magneto-optical or optical medium such as a disk or tape; as well as devices including a tangible transmission medium for carrying carrier wave signals such as a signal embodying computer instructions; and/or a digital file attachment to e-mail or other self-contained information archive or set of archives considered to be a distribution medium equivalent to a tangible storage medium. Accordingly, the disclosure is considered to include any one or more of a computer-readable medium or a distribution medium, as listed herein and to include recognized equivalents and successor media, in which the software implementations herein are stored.

The disclosed processing sequences were compared to observed SOC values for a battery system. An A306 battery cell available from EnerDel located in Indianapolis, Ind. was tested with the Hybrid Pulse Power Characterization Test ("HPPC") procedure and other test cycles.

The HPPC test consists of a series of discharge and regen pulses performed at every 10% depth of discharge (DOD) increment, with an hour rest at open circuit at each increment to ensure that the battery has electrochemically equilibrated. The open circuit voltage is determined after the hour rest. In addition, the battery current (I) and the terminal voltage ($V_t$) are monitored throughout the testing to provide input to the disclosed processing sequences.

Referring to Tables I-III, the disclosed processing sequences are compared to observed SOC values. In column (A) of each of Tables I-III, an observed SOC for the A306 battery cell is provided. The observed SOC is determined based on the measured open circuit voltage (OCV) of the A306 cell. In columns (B)-(D), SOC values determined by the disclosed processing sequences are provided. Column (B) provides the maximum SOC value determined during the one hour after respective discharge interval. Column (C) provides the minimum SOC value determined during the one hour after the respective discharge interval. Column (D) provides the determined SOC value at one hour after the discharge interval.

TABLE I

HPPC test, chamber temperature −20 C. (A306 cell)

| Test Data (A) SOC from OCV (1 hour after stop discharge) | Simulation (B) Max SOC reported within 1 hour after stop discharge | Simulation (C) Min SOC reported within 1 hour after stop discharge | Simulation (D) SOC reported at 1 hour after stop discharge | Max error B − A, C − A |
|---|---|---|---|---|
| 0.95 | 0.96 | 0.95 | 0.96 | +0.01, −0.00 |
| 0.87 | 0.87 | 0.84 | 0.87 | +0.00, −0.03 |
| 0.79 | 0.78 | 0.75 | 0.78 | −0.03, −0.04 |
| 0.69 | 0.69 | 0.67 | 0.69 | 0.00, −0.02 |
| 0.60 | 0.60 | 0.58 | 0.60 | 0.00, −0.02 |
| 0.49 | 0.51 | 0.49 | 0.51 | 0.02, 0.00 |
| 0.40 | 0.41 | 0.39 | 0.40 | 0.01, −0.01 |
| 0.29 | 0.31 | 0.28 | 0.29 | 0.02, −0.01 |
| 0.23 | 0.22 | 0.20 | 0.21 | −0.01, −0.03 |
| 0.15 | 0.16 | 0.14 | 0.15 | +0.01, −0.01 |

TABLE II

HPPC test, chamber temperature 15 C. (A306 cell)

| Test Data (A) SOC from OCV (1 hour after stop discharge) | Simulation (B) Max SOC reported within 1 hour after stop discharge | Simulation (C) Min SOC reported within 1 hour after stop discharge | Simulation (D) SOC reported at 1 hour after stop discharge | Max error B − A, C − A |
|---|---|---|---|---|
| 0.96 | 0.96 | 0.95 | 0.96 | 0.00, −0.01 |
| 0.86 | 0.87 | 0.84 | 0.85 | 0.01, −0.02 |
| 0.77 | 0.79 | 0.74 | 0.77 | 0.02, −0.03 |
| 0.67 | 0.70 | 0.65 | 0.67 | 0.03, −0.02 |
| 0.57 | 0.60 | 0.56 | 0.57 | 0.03, −0.01 |
| 0.48 | 0.50 | 0.46 | 0.48 | 0.02, −0.02 |
| 0.37 | 0.40 | 0.36 | 0.36 | 0.03, −0.01 |
| 0.25 | 0.28 | 0.24 | 0.25 | 0.03, −0.01 |
| 0.15 | 0.18 | 0.14 | 0.17 | 0.03, −0.01 |
| 0.08 | 0.10 | 0.07 | 0.08 | 0.02, −0.01 |
| 0.06 | 0.07 | 0.06 | 0.06 | 0.01, 0.00 |

TABLE III

HPPC cycle, chamber temperature 40 C. (A306 cell)

| Test Data (A) SOC from OCV (1 hour after stop discharge) | Simulation (B) Max SOC reported within 1 hour after stop discharge | Simulation (C) Min SOC reported within 1 hour after stop discharge | Simulation (D) SOC reported at 1 hour after stop discharge | Max error B − A, C − A |
|---|---|---|---|---|
| 0.97 | 0.98 | 0.97 | 0.98 | 0.01, 0.00 |
| 0.88 | 0.89 | 0.87 | 0.87 | 0.01, −0.01 |
| 0.79 | 0.81 | 0.77 | 0.79 | 0.02, −0.02 |
| 0.70 | 0.72 | 0.68 | 0.70 | 0.02, −0.02 |
| 0.61 | 0.62 | 0.59 | 0.60 | 0.01, −0.02 |
| 0.51 | 0.53 | 0.50 | 0.51 | 0.02, −0.01 |
| 0.40 | 0.43 | 0.40 | 0.40 | 0.03, 0.00 |
| 0.29 | 0.32 | 0.29 | 0.29 | 0.03, 0.00 |
| 0.18 | 0.21 | 0.18 | 0.18 | 0.03, 0.00 |
| 0.10 | 0.12 | 0.09 | 0.10 | 0.02, 0.01 |

In one embodiment, the disclosed processing sequences have an absolute error of about 3 percent of the observed data. In one embodiment, the disclosed processing sequences have an absolute error of up to about 3 percent of the observed data.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method for operating a state-of-charge (SOC) monitor for monitoring a battery operably coupled to a vehicle propulsion system, the method comprising:
    determining, with an electronic controller of the SOC monitor, a previous estimation of the SOC of the battery from a database;
    determining, with the electronic controller of the SOC monitor from the database, a polarization value for the battery, and a hysteresis value for the battery;
    measuring a terminal voltage of the battery via a voltage measurer of the SOC monitor, the voltage measurer of the SOC monitor providing the terminal voltage measurement to the electronic controller of the SOC monitor;
    measuring a current of the battery via a current measurer of the SOC monitor, the current measurer of the SOC monitor providing the current measurement to the electronic controller of the SOC monitor;
    determining, with the electronic controller of the SOC monitor, a first value of at least one battery parameter from the database including a plurality of values of the at least one battery parameter, the determination of the first value of the at least one battery parameter being based on the previous estimation of the SOC of the battery;
    determining, with the electronic controller of the SOC monitor, a calculated terminal voltage of the battery based on the polarization value for the battery, the hysteresis value for the battery, and the measured current of the battery;

determining, with the electronic controller of the SOC monitor, an updated estimation of the SOC of the battery based at least on the first value of the at least one battery parameter, the measured terminal voltage, and the calculated terminal voltage;

storing, by the electronic controller of the SOC monitor, the updated estimation of the SOC of the battery in the database;

providing, by the electronic controller of the SOC monitor, an indication of the updated estimation of the SOC of the battery to an output device;

supporting the battery and the electronic controller with a vehicle frame of a vehicle, the vehicle frame being supported by a plurality of ground engaging members;

operatively coupling the battery to the vehicle propulsion system of the vehicle to provide motive power to the vehicle propulsion system; and supporting the output device with the vehicle frame.

2. The method of claim 1, further comprising the step of measuring a temperature associated with the battery, wherein the first value of the at least one battery parameter is further based on the temperature associated with the battery.

3. The method of claim 1, wherein the step of determining the calculated terminal voltage of the battery includes the steps of:

determining an updated polarization value for the battery;
determining an updated hysteresis value for the battery;
determining an electric motive force value for the battery;
determining an internal resistance value for the battery; and determining the calculated terminal voltage of the battery based at least on the determined updated polarization value for the battery, the determined updated hysteresis value for the battery, the determined electric motive force for the battery, and the determined internal resistance value for the battery.

4. The method of claim 3, wherein the calculated terminal voltage is determined based on the relationship $Vtc=Ef+RI+hk+pk$ wherein Vtc is the calculated terminal voltage, Ef is the determined electric motive force value for the battery, R is the determined internal resistance value for the battery, I is the measured current for the battery, hk is the determined hysteresis value for the battery, and pk is the determined polarization value for the battery.

5. The method of claim 3, wherein the determined updated hysteresis value for the battery is determined based on the relationship $hk+1=ehsign(I)(1-e-|\mu I\delta t|)+hke-|\mu I\delta t|$ wherein hk+1 is the determined updated hysteresis value, eh is a hysteresis coefficient, $\mu$ is a hysteresis decay constant, $\delta t$ is a sampling time, and hk is a prior hysteresis value for the battery.

6. The method of claim 5, wherein the hysteresis coefficient is the at least one battery parameter and a value of the hysteresis coefficient is the first value from the database including the plurality of values of the at least one battery parameter, the first value of the at least one battery parameter being based on the estimation of the SOC of the battery.

7. The method of claim 3, wherein the determined updated polarization value for the battery is determined based on the relationship $pk+1=epsign(I)(1-e-K\delta t)+pke-K\delta t$ wherein pk+1 is the updated polarization value for the battery, ep is a polarization coefficient, K is a polarization decay constant, $\delta t$ is a sampling time, and pk is a prior polarization value.

8. The method of claim 7, wherein the polarization coefficient is the at least one battery parameter and a value of the polarization coefficient is the first value from the database including the plurality of values of the at least one battery parameter, the first value of the at least one battery parameter being based on the estimation of the SOC of the battery.

9. The method of claim 3, wherein the determined electric motive force is the at least one battery parameter and a value of the determined electric motive force is the first value from the database including the plurality of values of the at least one battery parameter, the first value of the at least one battery parameter being based on the estimation of the SOC of the battery.

10. The method of claim 3, wherein the determined internal resistance is the at least one battery parameter and a value of the determined internal resistance is the first value from the database including the plurality of values of the at least one battery parameter, the first value of the at least one battery parameter being based on the estimation of the SOC of the battery.

11. The method of claim 1, wherein the updated estimation of the SOC of the battery is determined based on the relationship $Ska=Sk+g(Vt-Vtc)$ wherein Ska is the updated estimation of the SOC of the battery, Sk is the estimation of the SOC of the battery, g is a SOC gain coefficient value, Vt is the measured terminal voltage value, and Vtc is the calculated terminal voltage value.

12. The method of claim 11, wherein the SOC gain coefficient is the at least one battery parameter and a value of the SOC gain coefficient is the first value from the database including the plurality of values of the at least one battery parameter, the first value of the at least one battery parameter being based on the estimation of the SOC of the battery.

13. The method of claim 1, wherein the updated estimation of the SOC of the battery is determined based on the relationship $Sk+1=Sk+g(Vt-Vtc)+(\gamma I \delta t)/Q$ wherein Sk+1 is the updated estimation of the SOC of the battery, Sk is the estimation of the SOC of the battery, g is a SOC gain coefficient value, Vt is the measured terminal voltage value, Vtc is the calculated terminal voltage value, $\gamma$ is an efficiency value of the battery, I is the measured current value, Q is a full charge capacity value of the battery, and $\delta t$ is a sampling time interval.

14. The method of claim 13, wherein the SOC gain coefficient is the at least one battery parameter and a value of the SOC gain coefficient is the first value from the database including the plurality of values of the at least one battery parameter, the first value of the at least one battery parameter being based on the estimation of the SOC of the battery.

15. The method of claim 1, wherein the electronic controller is operable via a user interface having a display, the display showing an indication of the updated estimation of the SOC determined by the electronic controller.

16. A state-of-charge (SOC) monitoring system for monitoring a SOC of a battery system operably coupled to a vehicle propulsion system, the system comprising:

at least one measurement element configured for measuring a terminal voltage and a current of the battery system during a sample time;

a storage element configured for storing at least an estimation of the SOC of the battery, the measured terminal voltage of the battery, the measured current of the battery, and a plurality of values of at least one battery parameter, the plurality of values of the at least one battery parameter being related to a plurality of values of the SOC of the battery; and a processing element operatively coupled to the measurement element and the storage element, the processing element configured to:
  determine a previous estimation of the SOC of the battery from the storage element;
  determine a polarization value for the battery, and a hysteresis value for the battery;
  determine a calculated terminal voltage of the battery based on the polarization value for the battery, the hysteresis value for the battery, and the measured current of the battery;
  determine an updated estimation of the SOC of the battery based at least on a first value of the plurality of values of the at least one battery parameter, the measured terminal voltage, and the calculated terminal voltage, the first value corresponding to the previous estimation of the SOC of the battery;
  store the updated estimation of the SOC of the battery to the storage element; and provide an indication of the updated estimation of the SOC of the battery to an output device, wherein:
  the battery and the processing element are supported by a vehicle frame of a vehicle, the vehicle frame being supported by a plurality of ground engaging members;
  the battery is operatively coupled to the vehicle propulsion system of the vehicle to provide motive power to the vehicle propulsion system; and
  the output device is supported by the vehicle frame.

17. The system of claim 16, wherein the at least one measurement element is further configured to measure a temperature associated with the battery and the first value of the at least one battery parameter is further based on the temperature associated with the battery.

18. The system of claim 16, wherein the processing element determines the calculated terminal voltage of the battery through a processing sequence including the steps of:
  determining an updated polarization value for the battery;
  determining an updated hysteresis value for the battery;
  determining an electric motive force value for the battery;
  determining an internal resistance value for the battery; and
  determining the calculated terminal voltage of the battery based at least on the determined updated polarization value for the battery, the determined updated hysteresis value for the battery, the determined electric motive force for the battery, and the determined internal resistance value for the battery.

19. The system of claim 18, wherein the processing element determines the calculated terminal voltage of the battery based on the relationship $Vtc=Ef+RI+hk+pk$ wherein Vtc is the calculated terminal voltage, Ef is the determined electric motive force value for the battery, R is the determined internal resistance value for the battery, I is the measured current for the battery, hk is the determined hysteresis value for the battery, and pk is the determined polarization value for the battery.

20. The system of claim 18, wherein the processing element determines the determined updated hysteresis value for the battery is determined based on the relationship $hk+1=ehsign(I)(1-e^{-|\mu I\delta t|})+hke^{-|\mu I\delta t|}$ wherein hk+1 is the determined updated hysteresis value, eh is a hysteresis coefficient, $\mu$ is a hysteresis decay constant, $\delta t$ is a sample time, and hk is a prior hysteresis value for the battery.

21. The system of claim 20, wherein the hysteresis coefficient is the at least one battery parameter and a value of the hysteresis coefficient is the first value of the plurality of values of the at least one battery parameter, the first value of the at least one battery parameter being based on the estimation of the SOC of the battery.

22. The system of claim 18, wherein the processing element determines the determined updated polarization value for the battery based on the relationship $pk+1epsign(I)(1-e^{-K\delta t})+pke^{-K\delta t}$ wherein pk+1 is the updated polarization value for the battery, ep is a polarization coefficient, K is a polarization decay constant, $\delta t$ is a sample time, and pk is a prior polarization value.

23. The system of claim 22, wherein the polarization coefficient is the at least one battery parameter and a value of the polarization coefficient is the first value of the plurality of values of the at least one battery parameter, the first value of the at least one battery parameter being based on the estimation of the SOC of the battery.

24. The system of claim 18, wherein the determined electric motive force is the at least one battery parameter and a value of the determined electric motive force is the first value of the plurality of values of the at least one battery parameter, the first value of the at least one battery parameter being based on the estimation of the SOC of the battery.

25. The system of claim 18, wherein the determined internal resistance is the at least one battery parameter and a value of the determined internal resistance is the first value of the plurality of values of the at least one battery parameter, the first value of the at least one battery parameter being based on the estimation of the SOC of the battery.

26. The system of claim 16, wherein the updated estimation of the SOC of the battery is determined by the processing element based on the relationship $Ska=Sk+g(Vt-Vtc)$ wherein Ska is the updated estimation of the SOC of the battery, Sk is the estimation of the SOC of the battery, g is a SOC gain coefficient value, Vt is the measured terminal voltage value, and Vtc is the calculated terminal voltage value.

27. The system of claim 26, wherein the SOC gain coefficient is the at least one battery parameter and a value of the SOC gain coefficient is the first value of the plurality of values of the at least one battery parameter, the first value of the at least one battery parameter being based on the estimation of the SOC of the battery.

28. The system of claim 16, wherein the updated estimation of the SOC of the battery is determined by the processing element based on the relationship $Sk+1=Sk+g(Vt-Vtc)+(\gamma I\delta t)/Q$ wherein Sk+1 is the updated estimation of the SOC of the battery, Sk is the estimation of the SOC of the battery, g is a SOC gain coefficient value, Vt is the measured terminal voltage value, Vtc is the calculated terminal voltage value, $\gamma$ is an efficiency value of the battery, I is the measured current value, Q is a full charge capacity value of the battery, and $\delta t$ is a sample time.

29. The system of claim 28, wherein the SOC gain coefficient is the at least one battery parameter and a value of the SOC gain coefficient is the first value of the plurality of values of the at least one battery parameter, the first value of the at least one battery parameter being based on the estimation of the SOC of the battery.

30. The system of claim 16, wherein the processing element is operable via a user interface having a display, the display showing an indication of the updated estimation of the SOC determined by the processing element.

* * * * *